(12) United States Patent
Mullis

(10) Patent No.: US 6,324,855 B1
(45) Date of Patent: Dec. 4, 2001

(54) PROXIMITY ICE LEVEL DETECTOR, PROXIMITY DETECTOR ASSEMBLY AND METHODS

(75) Inventor: John Mullis, Newman, GA (US)

(73) Assignee: Hoshizaki America, Inc., Peachtree City, GA (US)

(*) Notice: Subject to any disclaimer, the term of this patent is extended or adjusted under 35 U.S.C. 154(b) by 0 days.

(21) Appl. No.: 09/650,760

(22) Filed: Aug. 29, 2000

(51) Int. Cl.⁷ ........................................ F25C 1/00
(52) U.S. Cl. ..................... 62/137; 62/233; 340/686.6
(58) Field of Search ..................... 62/137, 344, 233; 340/686.6, 693.5

(56) References Cited

U.S. PATENT DOCUMENTS

| | | | |
|---|---|---|---|
| 5,121,110 | * | 6/1992 | Mahar, Jr. et al. ........... 340/693 |
| 6,093,312 | * | 7/2000 | Boulter ........................ 62/344 |
| 6,112,946 | * | 9/2000 | Bennett et al. .............. 222/1 |

* cited by examiner

Primary Examiner—William E. Tapolcai
Assistant Examiner—Mohammad M. Ali
(74) Attorney, Agent, or Firm—Arent Fox Kintner Plotkin & Kahn PLLC

(57) ABSTRACT

A proximity ice level detector detects a full ice level state of ice made and dispensed by an ice maker into an ice bin and includes a proximity sensor and a controller. The proximity sensor is disposed in or adjacent the ice bin at the full ice level state of the ice in the ice bin. The controller is operative in conjunction with the proximity sensor and the ice maker for reading signals from the proximity sensor. When the proximity sensor fails to detect the ice at the full ice level state, the controller causes the ice maker to make ice and dispense the ice into the ice bin. When the proximity sensor detects the ice at the full ice level state, the controller causes the ice maker to cease making ice. Another embodiment of the invention is a proximity detector assembly that includes the proximity sensor encased within a sleeve fabricated from a food-packaging grade plastic. A method for detecting a full ice level state of ice in the ice bin and a method for making ice from an ice maker are also described.

19 Claims, 6 Drawing Sheets

PROXIMITY ICE LEVEL DETECTOR, PROXIMITY DETECTOR ASSEMBLY AND METHODS

FIELD OF THE INVENTION

The present invention relates to a ice level detector that detects a full ice level state of ice in an ice bin. More particularly, the invention is directed to a proximity ice level detector.

BACKGROUND OF THE INVENTION

Various types of ice level detecting devices are known in the art to detect a full ice level state of ice in an ice bin. Many of these devices use mechanical arms, photo sensors, ultrasonic energy and thermostats.

U.S. Pat. No. 3,911,691 to Kohl et al. teaches an ice level sensing mechanism that includes a generally vertically disposed pendulum element that is pivotally supported at an upper end. The lower end of the pendulum is moveable in any direction. The ice level sensing mechanism also includes a contact device that is disposed in a surrounding relationship to a portion of the pendulum element. The contact device is engaged by the pendulum element when the ice level within the ice storage bin reaches a predetermined magnitude. The pendulum and the contact device are operatively connected to an electrical control circuit associated with an ancillary ice producing machine that supplies ice to the storage bin.

U.S. Pat. No. 4,662,182 to Tsukiyama et al. discloses an ice storage detector for use with an ice maker and ice reservoir. The ice storage detector includes an ice detection plate that is pivotally mounted in the ice reservoir. The ice storage detector also includes means for supporting the detection plate and a proximity sensor that is disposed above the detection plate. The detection plate is pivotable about a horizontal shaft between a non-ice detecting position and an ice detecting position. In the ice detecting position, the ice detection plate is displaced in a direction away from a top of the ice pile to cause the proximity sensor to generate an ice detecting signal.

U.S. Pat. No. 4,822,996 to Lind reveals an ice bin level sensor with a time delay. The ice bin level sensor includes an electrical circuit that operates an ice maker using a light interrupter system. A pulsed light source is positioned for interference when the ice has reached a predetermined level in the ice containing bin. The circuit activates the ice maker once the light source is sensed for a predetermined period of time and deactivates the ice maker when the light source is not sensed for another predetermined period of time.

U.S. Pat. No. 4,947,652 to Arcangeli teaches an ice level control for a flake ice maker. The flake ice maker has a housing, a refrigerated surface in the housing, a rotary scraper for scraping ice from the refrigerated surface and for discharging the scraped ice into an underlying ice bin. The rotary scraper is driven by a rotary drive shaft electrically grounded to a common ground with a control circuit connected for controlling rotation of the scraper. A sensing arm is attached to the drive shaft for sweeping a path in the ice bin. A switch actuatable upon contact of the arm with accumulated ice in the ice bin completes an electrical circuit through the drive shaft thereby interrupting the operation of the ice maker.

U.S. Pat. No. 5,060,484 to Bush et al. discloses a bin level control circuit and a transducer mounting system for an ice making machine. An ultrasonic bin level control circuit employs a fail-safe circuit to shut off a compressor when echoes are late or absent. A transducer mounting system facilitates installation and removal of a transducer for servicing and cleaning. A level detector compares a reference signal with a reflected signal with the ice reaching a desired level when the reflected signal overlaps the reference signal. When the desired level is reached, the reference signal is modified through feedback to prevent short cycling of the compressor.

U.S. Pat. No. 5,131,234 to Furukawa et al. teaches an ice level detecting apparatus for ice making machines. The ice detecting apparatus includes a thermostat having a temperature sensor element and a holder for holding the sensor element in a spaced relationship with an ice stocker inner wall.

Ice level detector devices that use moveable mechanical arms, pendulums or levers can be problematic. Particularly, the moveable mechanical arms, pendulums and levers can break or become "jammed," sometimes as a result of ice build-up. Further, moveable mechanical levers, pendulums and arms are relatively sensitive to rugged handling. The photosensitive or ultrasonic ice level detectors can also be problematic. Particularly, the photo sensors or ultrasonic transducers can be rendered inoperative because of mold, condensation, scale or algae build-up thereon. As a result, these devices must be kept clean. Also, such devices are not conducive to rugged handling. Although an ice level detector device using a thermostat can be effective, the thermostat is also not conducive to rugged handling.

OBJECTS AND SUMMARY OF THE INVENTION

It is an object of the invention to provide a proximity ice level detector that does not use moving parts.

Another object of the invention is to provide a proximity ice level detector that can be used in a more rugged environment in comparison with ice level detectors that employ moveable mechanical arms, pendulums or levers.

Yet another object of the invention is to provide a proximity ice level detector that can be bumped or jostled without fear of rendering it inoperative.

A still further object of the invention is to provide a proximity ice level detector that can be installed at a variety of locations on or adjacent an ice bin that accumulates ice dispensed from an ice maker.

A further object of the invention is to provide a proximity ice level detector that is virtually insensitive to mold, condensation, scale or algae build-up.

Accordingly, a proximity ice level detector of the invention detects a full ice level state of ice made and dispensed by an ice maker into an ice bin and includes a proximity sensor and a controller. The proximity sensor is disposed in or adjacent the ice bin at the full ice level state of the ice in the ice bin. The controller is operative in conjunction with the proximity sensor and the ice maker for reading signals from the proximity sensor. When the proximity sensor detects the ice is at the full ice level state, the controller causes the ice maker to cease making ice. When the proximity sensor fails to detect the ice at the full ice level state, the controller causes the ice maker to make ice and dispense the ice into the ice bin.

An alternative embodiment of the invention is a proximity detector assembly that is used to detect the presence of an item or items that are consumable by humans. The proximity detector assembly includes a sleeve and the proximity sensor. The sleeve is fabricated from a plastic material that is deemed acceptable for contact with the items consumable by humans. The proximity sensor is encased within the sleeve and is isolated from contact with the consumable items. The proximity sensor is operative for detecting the presence of the consumable items when the consumable items are positioned within an invisible field of detection of the proximity sensor.

Another embodiment of the invention is a method for detecting the full ice level state of ice in the ice bin. One step is positioning the proximity sensor in or adjacent the ice bin at the full ice level state of the ice in the ice bin. Another step is reading signals from the proximity sensor. Another step is causing either the ice maker to cease making ice when the signals from the proximity sensor detect that the ice is at the full ice level state and to make ice when signals from the proximity sensor detect that the ice is below the full ice level state.

Another embodiment of the invention is a method for making ice from the ice maker and dispensing the made ice into the ice bin until the ice bin reaches the full ice level state. One step is positioning the proximity sensor as described above. Another step is controlling the proximity sensor and the ice maker by reading signals from the proximity sensor. Another step is causing the ice maker to cease making ice when the signals from the proximity sensor detect the ice is at the full ice level state. Another step is causing the ice maker to make ice and to dispense the ice into the ice bin when the signals from the proximity sensor fail to detect the ice at the full ice level state.

These and other objects of the invention will become better understood when taken in conjunction with the detailed description of the exemplary embodiments and the drawing figures.

DETAILED DESCRIPTION OF THE EXEMPLARY EMBODIMENTS

A proximity ice level detector of the invention and related exemplary embodiments are hereinafter described using a conventional ice maker and a conventional ice bin. As is known in the art, the conventional ice maker makes ice and thereafter dispenses the ice into the conventional ice bin. One of ordinary skill in the art would appreciate that the term "dispenses" is intended to include the term "harvests." Thus, the term "dispense" and all variations of it connote the term "harvest" and all corresponding variations of it.

Figure 1:
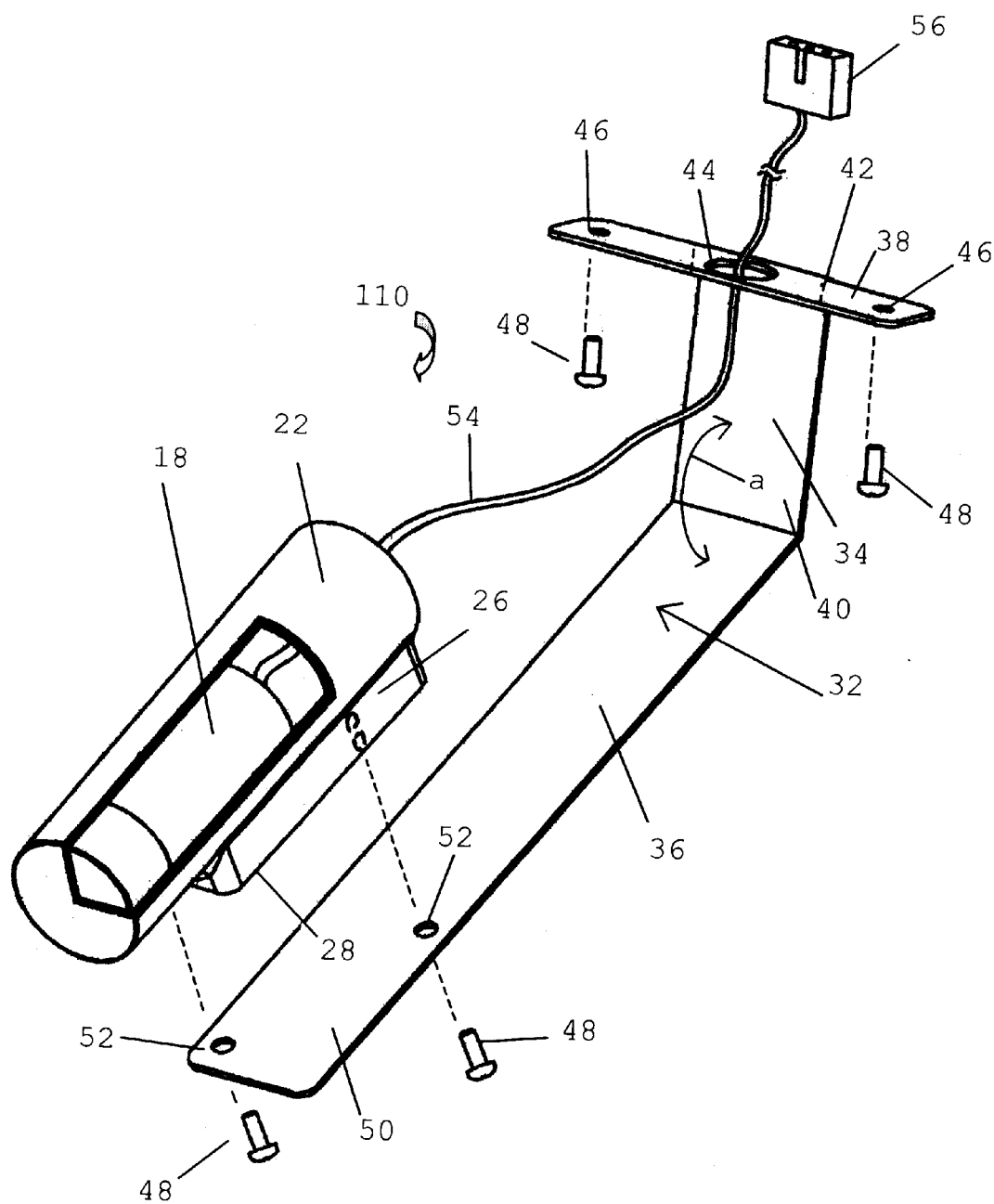
FIG. 1 is a perspective view of a proximity detector assembly that includes a proximity ice level detector of the invention.
Figure 2A:
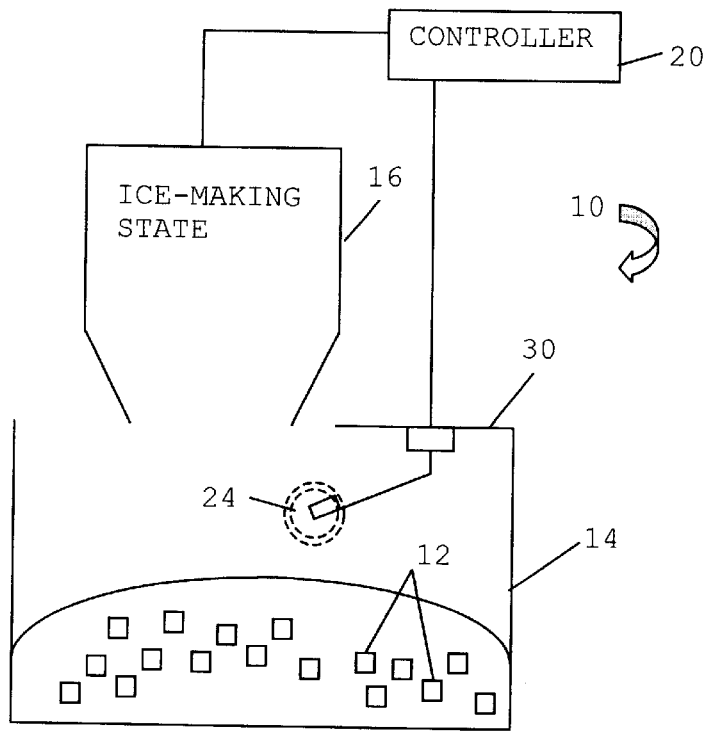
FIG. 2A is a diagrammatical view of the proximity ice level detector of the invention disposed in an ice bin positioned below an ice maker in an ice-making state.
Figure 2B:
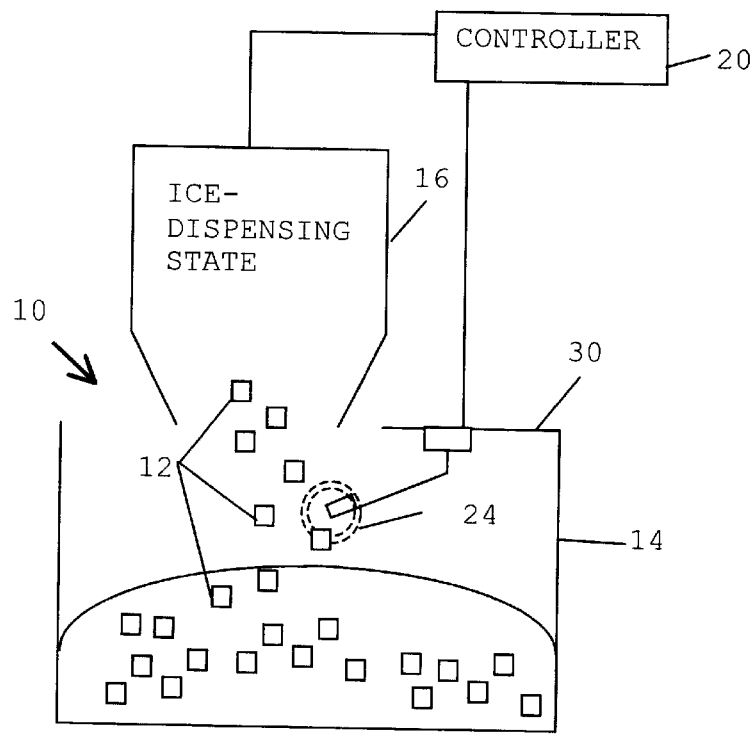
FIG. 2B is a diagrammatical view, similar to FIG. 2A, with the ice maker in an ice-dispensing state.
Figure 2C:
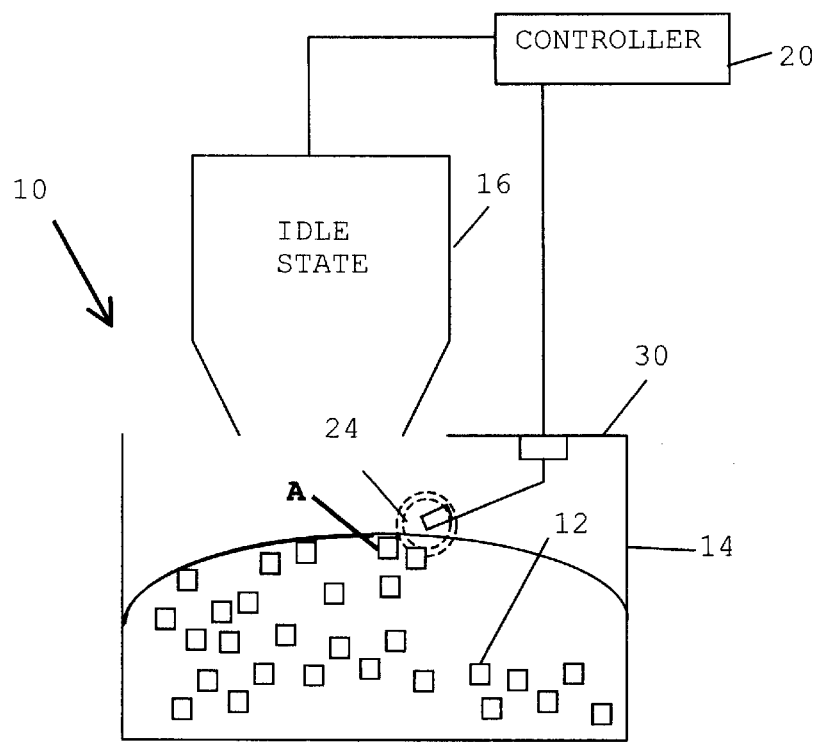
FIG. 2C is a diagrammatical view, similar to FIGS. 2A and 2B, with the ice maker in an idle state.

A first exemplary embodiment of a proximity ice level detector 10 of the invention is introduced in FIGS. 1–2C. The proximity ice level detector 10 of the invention detects a full ice level state (FIG. 2C) of ice 12 in an ice bin 14. The ice 12 is made and dispensed by an ice maker 16. The proximity ice level detector 10 of the invention includes a proximity sensor 18 shown in FIG. 1 and a controller 20 shown in FIGS. 2A–2C. For the first exemplary embodiment of the proximity ice level detector 10 of the invention, the proximity sensor 18 is encased within a sleeve 22, which is fabricated from a plastic material that is deemed acceptable for contact with food or other items consumable by humans. For the first exemplary embodiment of the proximity ice level detector 10 of the invention, the proximity sensor 18 is disposed in the ice bin 14 at the full ice level state of the ice 12 in ice bin 14. The proximity sensor 18 is a conventional proximity sensor such as an Adjustable Capacitive Prox E2K-C manufactured by Omron Corporation of Kyoto, Japan. One of ordinary skill in the art would appreciate that the conventional proximity sensor 18 generates an invisible field of detection 24 as illustrated by the dashed lines 24 from the proximity sensor 18. The E2K-C permits non-contact detection of metallic and non-metallic objects such as glass, wood, water, oil and plastic. One of ordinary skill in the art would appreciate that, when the ice 12 or other consumable items penetrate the invisible field of detection 24, the proximity sensor 18 therefore detects the ice 12 or other consumable items. Upon detection, the ice 12 is considered to be at the full ice level state as indicated in FIG. 2C with the ice maker 16 in the idle state. Thus, a skilled artisan would appreciate that the full ice level state is not intended to be a precise volume or level of ice 12 contained in the ice bin 14.

The controller 20 is operative in conjunction with the ice maker 16 and the proximity sensor 18 and reads electrical signals from the proximity sensor 18. As best shown in FIG. 2A, when the proximity sensor 18 fails to detect the ice 12 at the full ice level state, the controller 20 causes the ice maker 16 to make ice 12 and to dispense the ice 12 into the ice bin 14, when appropriate. In other words, when the ice 12 is not detected at the full ice level state, the ice maker 16 is in an ice-making state. As best shown in FIG. 2C, when the proximity sensor 18 detects the ice 12 at the full ice level state, the controller 20 causes the ice maker 16 to cease making the ice 12. The ice maker 16 is now in an idle state.

In FIG. 1, the sleeve 22 is fabricated from a material that is approved for use by National Sanitation Foundation (NSF) for contact with items, such as ice, consumed by humans. Preferably, the material is a food-packaging grade plastic such as polystyrene (PS), acrylonitrile butadiene styrene (ABS), polyethylene (PE), polyurethane (PUR), polytetrafluoroethylene (PTFE) and other food-packaging grade plastics. Although not by way of limitation, the sleeve 22 is a cylindrical tube that is sized and adapted to ASP encase the proximity sensor 18 in a hermetically sealed manner. The sleeve 22 includes a mounting segment 26 that is integrally formed with the sleeve 22 as a unitary construction. The mounting segment 26 has a flattened mounting surface 28, which is discussed in more detail below.

In FIG. 1, the proximity sensor 18 and the sleeve 22 form a proximity detector assembly 110. Although the proximity detector assembly 110 is described herein for use to detect the full ice level state of ice in an ice bin, the proximity detector assembly 110 can also be used to detect the presence of any item or items consumable by humans. In brief, the proximity sensor 18 detects the presence of a consumable item or items when the consumable item or items are positioned within the invisible field of detection of the proximity sensor 18. A skilled artisan would appreciate that the sleeve 22 isolates the proximity sensor 18 from contact with the consumable items. By way of example only, the ice 12 represents the consumable items.

In FIGS. 2A–2C, the proximity detector assembly 110, i.e., the proximity sensor 18 and the sleeve 22, is secured to a support structure 30. In this case, the support structure 30 is a top wall of the ice bin 14. Note in FIG. 2B, the proximity sensor 18 is placed in a path of the ice 12 as it is dispensed from the ice maker 16 in an ice-dispensing state. Thus, the proximity detector assembly 110 is sufficiently rugged to withstand being bumped and jostled, for example, by ice, without fear of breakage.

As shown in FIG. 1, the proximity detector assembly 110 also includes a bracket structure 32. The bracket structure 32 includes a primary leg 34, a secondary leg 36 and a mounting bar 38. The primary leg 34 has one end 40 and an opposite end 42. The secondary leg 36 is connected to the one end 40 of the primary leg 34 in a manner such that the primary leg 34 and the secondary leg 36 form an obtuse angle "a." The mounting bar 38 is connected at the opposite end 42 of the primary leg 34 to form a T-shaped configuration. The mounting bar 38 includes a cable-receiving hole 44 and a pair of mounting bar holes 46 that receive respective ones of fasteners 48, such as screws.

As shown in FIG. 1, the secondary leg 36 has a free end portion 50 that is spaced apart from the primary leg 34. The sleeve 22 containing the proximity sensor 18 is releaseably connected to the bracket structure 32. Particularly, the flattened mounting surface 28 and the free end portion 50 of the secondary leg 36 contact each other. A pair of fasteners 48, such as screws, are received through respective holes 52 in the free end portion 50. The screws 48 extending through the holes 52 penetrate the mounting segment 26 to secure the proximity sensor 18 and the sleeve 22 to the bracket structure 32. Further, an electrical cable 54 connects the proximity sensor 18 encased within the sleeve 22, extends through the cable receiving hole 44 and terminates at an electrical connector 56.

Figure 3A:
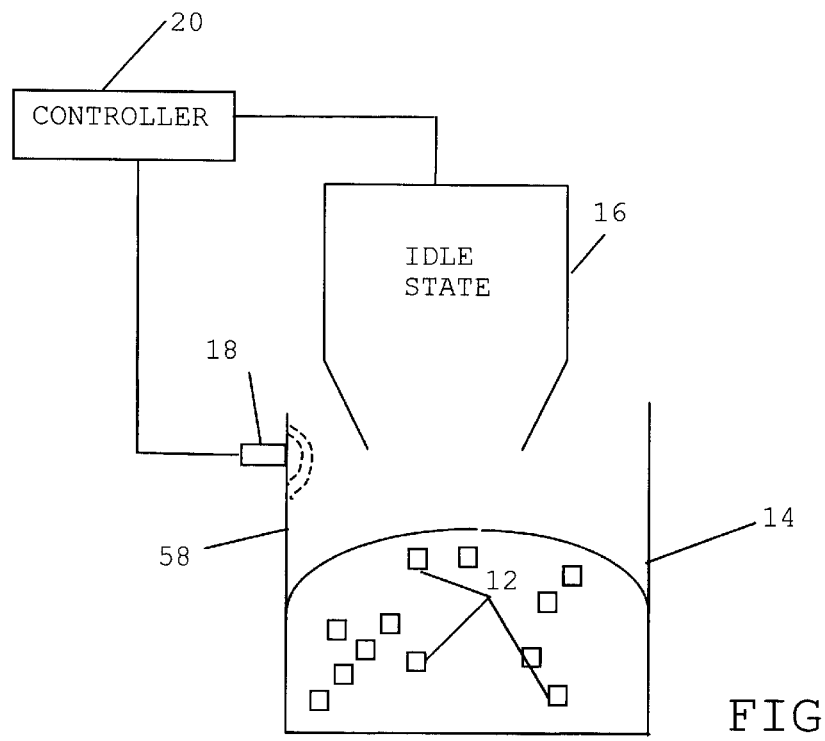
FIG. 3A is a diagrammatical view of the proximity ice level detector of the invention connected to a sidewall of the ice bin illustrating the ice below a full ice level state.
Figure 3B:
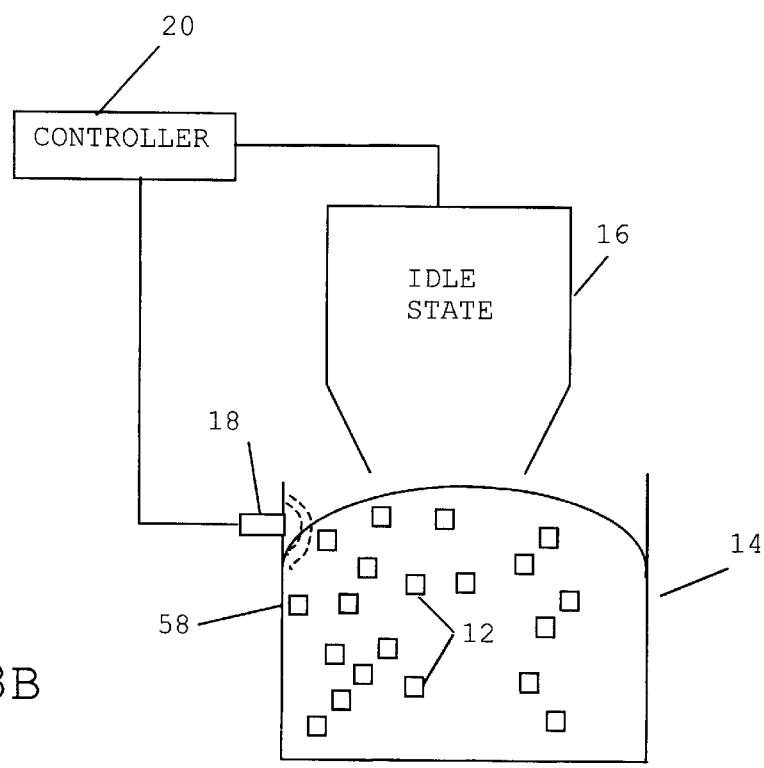
FIG. 3B is a diagrammatical view of the proximity ice level detector in FIG. 3A sensing the ice at the full ice level state.

In FIGS. 3A and 3B, the proximity sensor 18 is connected exteriorly to a sidewall 58 of the ice bin 14. As shown in FIG. 3B, the full ice level state of the ice 12 in the ice bin 14 is detected adjacent the sidewall 58. By contrast, the full ice level state of the ice 12 in the ice bin 14 shown in FIG. 2C is detected adjacent an apex A of the ice 12. In either position, the proximity sensor 18 must be located so that another batch of ice 12 can be dispensed from the ice maker 16 without causing back-up of the ice within the ice maker 16.

Figure 4:
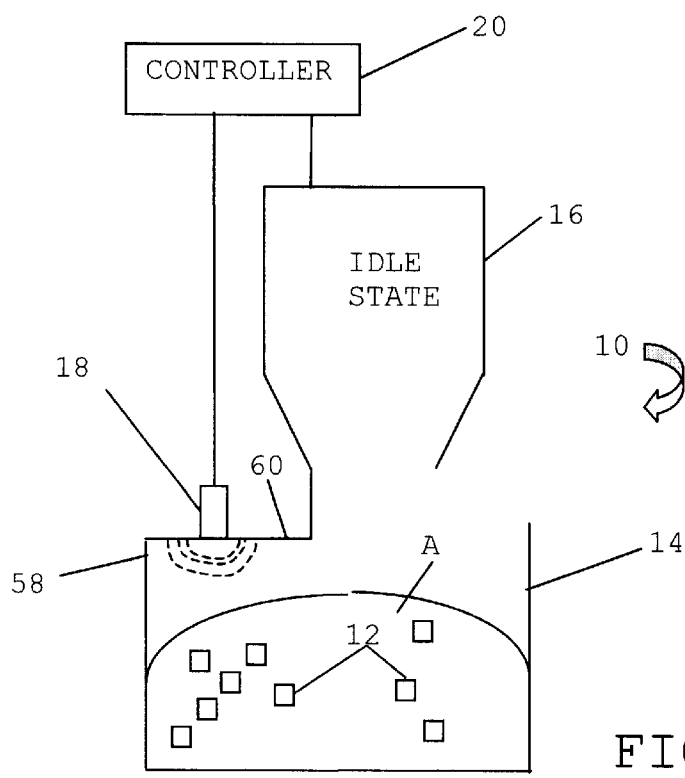
FIG. 4 is a diagrammatical view of the proximity ice level detector connected to the ice maker positioned above and adjacent the ice bin.

In FIG. 4, the proximity sensor 18 is positioned on a horizontal wall 60 of the ice maker 16 and adjacent the ice bin 14. Thus, the proximity sensor 18 can be located at a variety of positions such as above the ice 12, between the sidewall 58 of the ice bin 14 and the apex A of the accumulating ice 12 and at the apex A of the accumulating ice 12.

One of ordinary skill in the art would appreciate that the proximity sensor 18 in FIGS. 3A-4 can be used either by itself or with a plastic sleeve or covering.

In FIGS. 2A-4, the controller 20 is operative to continuously read electrical signals from the proximity sensor 18 and to ignore a portion of the continuously read electrical signals while the ice maker 16 is dispensing the ice 12 into the ice bin 14. Further, the controller 20 is operative to respond to a remaining portion of the continuously read electrical signals during a fixed period of time by causing the ice maker 16 to make ice or cease making ice. Preferably, the fixed period of time commences after the ice maker 16 dispenses ice into the ice bin 14, continues while the ice maker 16 is making ice and terminates before the ice maker 16 completes making ice.

Figure 5:
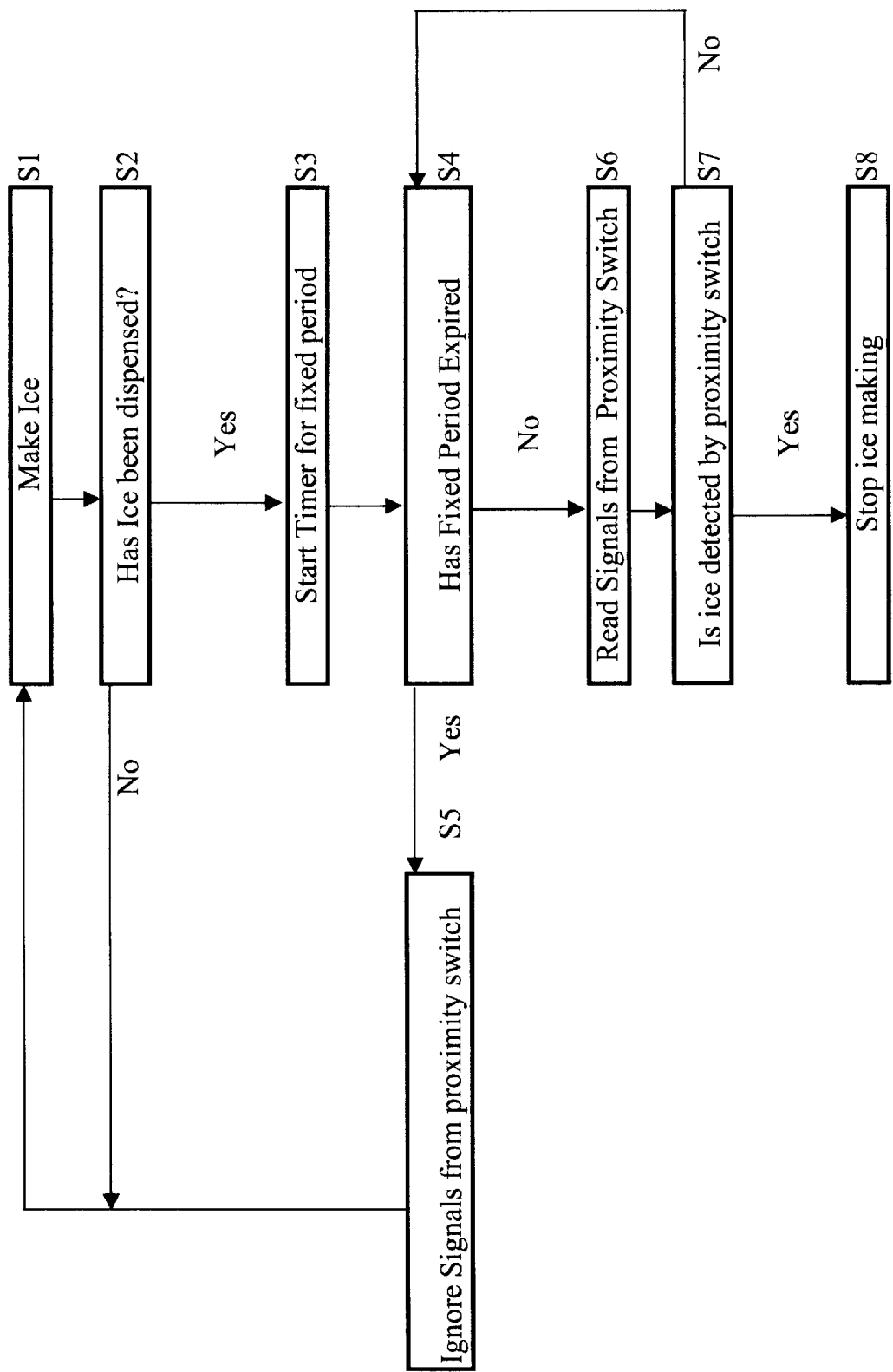
FIG. 5 is a flow chart depicting an exemplary method for detecting the full ice level state of ice in the ice bin using a proximity sensor.

In conjunction with the ice maker 16, the proximity sensor 18 and the controller 20, another exemplary embodiment of the invention is a method that detects a full ice level state of ice in the ice bin as shown by the flow chart in FIG. 5. Step S1 causes the ice maker 16 to make ice. The method then moves to Step S2 that determines whether ice has been dispensed. If the ice has not been dispensed, the method reverts back to Step 1. If it has been determined that ice has been dispensed, the method moves to Step S3. Step S3 starts a timer for a fixed period of time, for example, five minutes, after the ice has been dispensed by the ice maker. The method then moves to Step S4, where it is determined whether the fixed period of time has expired. If it is determined that the fixed period of time has expired, the method moves to S5. In Step S5, the controller ignores the signals from the proximity sensor, which, in turn, causes the ice maker to make ice in Step S1. If it is determined that the fixed period of time has not expired, the method moves to Step S6. In Step S6, the signals from the proximity sensor are read. The method then moves to Step S7, where the controller determines from the read signals whether ice is at the full ice level state. If the controller determines that the ice is not at the full ice level state, the method then returns to Step S4. If the controller determines that the ice is at the full ice level state, the method moves to Step S8. In Step S8, the controller 20 causes the ice maker 16 to cease making ice.

Figure 6:
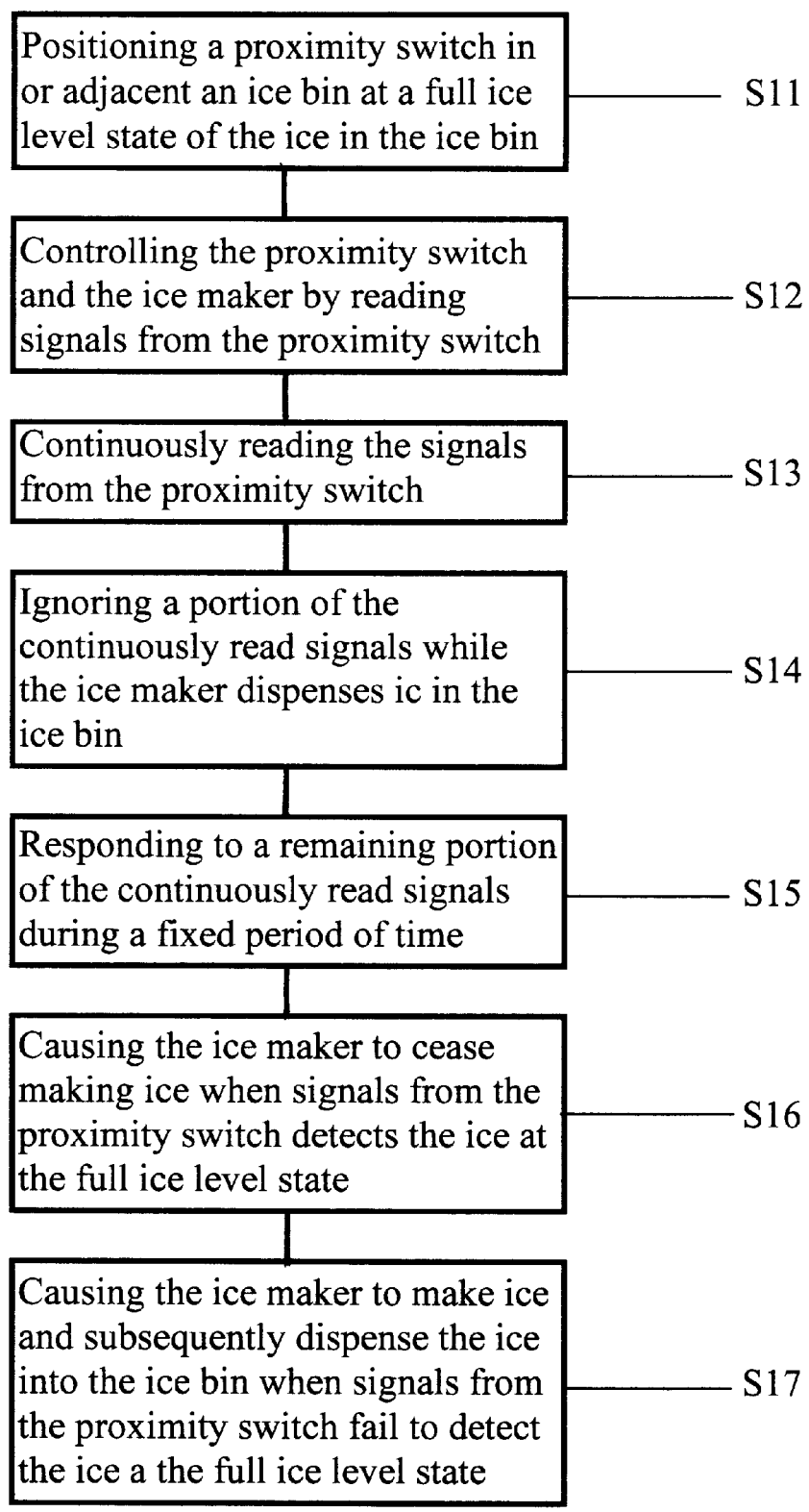
FIG. 6 is a flow chart for making and dispensing ice using a proximity sensor.

Also, in conjunction with the ice maker 16, the proximity sensor 18 and the controller 20, another exemplary embodiment of the invention is a method that makes ice from the ice maker and dispenses the made ice into the ice bin until the ice bin reaches a full ice level state as shown in the flow chart in FIG. 6. This method begins with Step S11. In Step S11, the proximity sensor is positioned in or adjacent the ice bin at a full ice level state of the ice in the ice bin. Step S12 includes controlling the proximity sensor and the ice maker by reading the signals from the proximity sensor. Step S13 includes continuously reading the signals from the proximity sensor. In Step S14, a portion of the continuously read signals are ignored by the controller while the ice maker dispenses ice into the ice bin. Step S14 includes responding to a remaining portion of continuously read signals during a fixed period of time. In Step S16, the controller causes the ice maker to cease making ice when the signals from the proximity sensor detect that the ice is at the full ice level state. In Step S17, the controller causes the ice maker to make ice and subsequently dispense the ice into the ice bin when signals from the proximity sensor fail to detect that the ice is at the full ice level state.

The proximity ice level detector of the invention does not use any moving parts. As a result, a skilled artisan would appreciate the benefits of avoiding broken or jammed mechanical arms and levers as is known in the prior art. Furthermore, the proximity ice level detector of the invention can withstand a more rugged environment than conventional mechanical arms and levers and conventional thermostats. Thus, the proximity ice level detector of the invention can be bumped or jostled without fear of rendering it inoperative. Also, the proximity ice level detector of the invention can be installed at a variety of locations on or adjacent the ice bin. Additionally, the proximity ice level detector of the invention is virtually insensitive to mold or algae build-up, unlike some conventional ice level detectors.

Although the exemplary embodiments of the invention have been described in detail, one of ordinary skill in the art would appreciate that changes to these exemplary embodiments can be made without departing from the spirit and concepts of the invention.

What is claimed is:

1. A proximity ice level detector for detecting a full ice level state of ice in an ice bin, the ice being made and dispensed by an ice maker, the proximity ice level detector comprising:
   a proximity sensor disposed in or adjacent the ice bin at the full ice level state of the ice in the ice bin;
   a controller operative in conjunction with the proximity sensor and the ice maker for reading signals from the proximity sensor such that, when the proximity sensor detects the ice at the full ice level state, the controller causes the ice maker to cease making ice and, when the proximity sensor fails to detect the ice at the full ice level state, the controller causes the ice maker to make ice and dispense the made ice into the ice bin; and
   a sleeve fabricated from a material approved for contact with items consumed by humans, the sleeve sized and adapted to encase the proximity switch therein.

2. A proximity ice level detector according to claim 1, wherein the material is a food-packaging grade plastic.

3. A proximity ice level detector according to claim 1, wherein the material is selected from a group of plastics consisting of polystyrene, acrylonitrile butadiene styrene, polyethylene, polyurethane and polytetrafluoroethylene.

4. A proximity ice level detector for detecting a full ice level state of ice in an ice bin, the ice being made and dispensed by an ice maker, the proximity ice level detector comprising:
   a proximity sensor disposed in or adjacent the ice bin at the full ice level state of the ice in the ice bin; and
   a controller operative in conjunction with the proximity sensor and the ice maker for reading signals from the proximity sensor such that, when the proximity sensor detects the ice at the full ice level state, the controller causes the ice maker to cease making ice and, when the proximity sensor fails to detect the ice at the full ice level state, the controller causes the ice maker to make ice and dispense the made ice into the ice bin,
   wherein the controller is operative to continuously read the signals from the proximity switch and ignore a portion of the continuously read signals while the ice maker is dispensing ice in the ice bin.

5. A proximity ice level detector according to claim 4, wherein the controller is operative to respond to a remaining portion of the continuously read signals during a fixed period of time by causing the ice maker to make ice or cease making ice.

6. A proximity ice level detector according to claim 5, wherein the fixed period of time commences after the ice maker dispenses ice into the ice bin, continues while the ice maker is making ice and terminates before the ice maker completes making the ice.

7. A proximity detector assembly for use to detect presence of an item or items consumable by humans, comprising:
   a sleeve fabricated from a plastic material deemed acceptable for contact with the consumable items; and
   a proximity sensor contained within the sleeve and isolated from contact with consumable items, the proximity sensor operative for detecting the presence of the consumable item or items when the consumable item or items are positioned within an invisible field of detection of the proximity sensor.

8. A proximity detector assembly according to claim 7, wherein the plastic material is selected from a group of plastic materials consisting of polystyrene, acrylonitrile butadiene styrene, polyethylene, polyurethane and polytetrafluoroethylene.

9. A proximity detector assembly according to claim 7, wherein the sleeve is a cylindrical tube encasing the proximity sensor in a hermetically sealed manner.

10. A proximity detector assembly according to claim 9, wherein the sleeve includes a mounting segment integrally formed with the sleeve, the mounting segment having a flattened mounting surface.

11. A proximity detector assembly according to claim 10, further comprising a bracket structure having a primary leg with opposite ends, a secondary leg and a mounting bar, the secondary leg being connected to one end of the primary leg so that the primary leg and secondary leg form an obtuse angle, the mounting bar connected to the primary leg at the opposite end to form a T-shaped configuration.

12. A proximity detector assembly according to claim 11, wherein the sleeve is releaseably connected to the bracket structure such that the flattened mounting surface and a free end portion of the secondary leg being space apart from the primary leg contact each other.

13. A method for detecting a full ice level state of ice in an ice bin with an ice maker making the ice and dispensing the ice into the ice bin, the method comprising the steps of:
   positioning a proximity sensor in or adjacent the ice bin at the full ice level state of the ice in the ice bin;
   reading signals from the proximity sensor;
   causing the ice maker to cease making ice when the signals from the proximity sensor detect that the ice is at the full ice level state;
   starting a timer for a fixed period of time after dispensing the ice made by the ice maker;
   determining whether the fixed period of time has expired;
   upon determining that the fixed period of time has expired, ignoring signals from the proximity switch and causing the ice maker to make ice;
   upon determining that the fixed period of time has not expired, reading the signals from the proximity switch to determine whether the ice is at the full ice level state; and
   upon determining that the fixed period of time has not expired and the ice is at the full ice level state, causing the ice maker to cease making ice.

14. A method for making ice from an ice maker and dispensing the made ice into an ice bin until the ice bin reaches a full ice level state, the method comprising the steps of:
   positioning a proximity switch in or adjacent the ice bin at the full ice level state of the ice in the ice bin;
   controlling the proximity switch and the ice maker by reading the signals from the proximity switch;
   causing the ice maker to make ice and dispense the ice into the ice bin when the signals from the proximity switch fail to detect the ice at the full ice level state;

continuously reading the signals from the proximity sensor; and ignoring a portion of the continuously read signals while the ice maker is dispensing ice in the ice bin.

15. A method according to claim 14, further comprising the step of responding to a remaining portion of the continuously read signals during a fixed period of time and the step of causing the ice maker to make ice or cease making ice.

16. A method according to claim 15, wherein the fixed period of time commences after the ice maker dispenses ice into the ice bin, continues while the ice maker is making ice and terminates before the ice maker completes making the ice.

17. A proximity detector assembly for use to detect presence of an item or items consumable by humans, comprising:

a sleeve fabricated from a plastic material deemed acceptable for contact with the consumable items; and a proximity sensor contained within the sleeve and isolated from contact with consumable items, the proximity sensor operative for detecting the presence of the consumable item or items when the consumable item or items are positioned within an invisible field of detection of the proximity sensor wherein the sleeve is formed as a tube encasing the proximity sensor in a hermetically sealed manner and includes a mounting segment integrally formed with the tube, the mounting segment having a flattened mounting surface.

18. A proximity detector assembly according to claim 17, further comprising a bracket structure having a primary leg with opposite ends, a secondary leg and a mounting bar, the secondary leg being connected to one end of the primary leg so that the primary leg and secondary leg form an obtuse angle, the mounting bar connected to the primary leg at the opposite end to form a T-shaped configuration.

19. A proximity detector assembly according to claim 18, wherein the sleeve is releasably connected to the bracket structure such that the flattened mounting surface and a free end portion of the secondary leg being space apart from the primary leg contact each other.

* * * * *